(12) United States Patent
Koerner

(10) Patent No.: US 7,659,788 B2
(45) Date of Patent: Feb. 9, 2010

(54) AMPLITUDE REGULATING CIRCUIT

(75) Inventor: Heiko Koerner, Soeding (AT)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 11/776,815

(22) Filed: Jul. 12, 2007

(65) Prior Publication Data

US 2008/0048793 A1    Feb. 28, 2008

(30) Foreign Application Priority Data

Jul. 12, 2006    (DE)    ................ 10 2006 032 276

(51) Int. Cl.
*H03L 5/00* (2006.01)
*H03B 5/12* (2006.01)

(52) U.S. Cl. ............... 331/183; 331/185; 331/117 FE

(58) Field of Classification Search ............. 331/109, 331/117 R, 117 FE, 167, 182, 183, 185, 186
See application file for complete search history.

(56) References Cited

U.S. PATENT DOCUMENTS

| | | | |
|---|---|---|---|
| 5,144,263 A | 9/1992 | Fenk | |
| 7,170,359 B2 | 1/2007 | Koerner | |
| 7,289,003 B2 * | 10/2007 | Blum | ............ 331/183 |
| 7,327,201 B2 * | 2/2008 | Miyashita et al. | ............ 331/185 |
| 2005/0073371 A1 * | 4/2005 | Brett et al. | ............ 331/74 |
| 2006/0006951 A1 | 1/2006 | Xu et al. | |
| 2006/0012447 A1 * | 1/2006 | Partovi et al. | ............ 331/185 |
| 2007/0182503 A1 * | 8/2007 | Petrofsky | ............ 331/185 |

FOREIGN PATENT DOCUMENTS

DE    10 2004 005 261 A1    8/2005
EP    0 462 304 B1    12/1991

* cited by examiner

*Primary Examiner*—Robert Pascal
*Assistant Examiner*—Ryan J. Johnson
(74) *Attorney, Agent, or Firm*—Slater & Matsil, L.L.P.

(57) ABSTRACT

An amplitude regulating circuit for an oscillator with an input for a supply signal having an electrical quantity depending on an amplitude of an oscillation of the oscillator has a supply circuit with a control input for a first control signal and a supply output for the supply signal based on the first control signal, a reference circuit with an input for a reference supply signal having a reference quantity, a reference supply circuit with a reference control input for a second control signal and a reference supply output for the reference supply signal based on the second control signal and a comparator circuit with a first control signal output for the first control signal based on the electrical quantity and the electrical reference quantity and a second control signal output for the second control signal based on the electrical quantity and the electrical reference quantity.

25 Claims, 5 Drawing Sheets

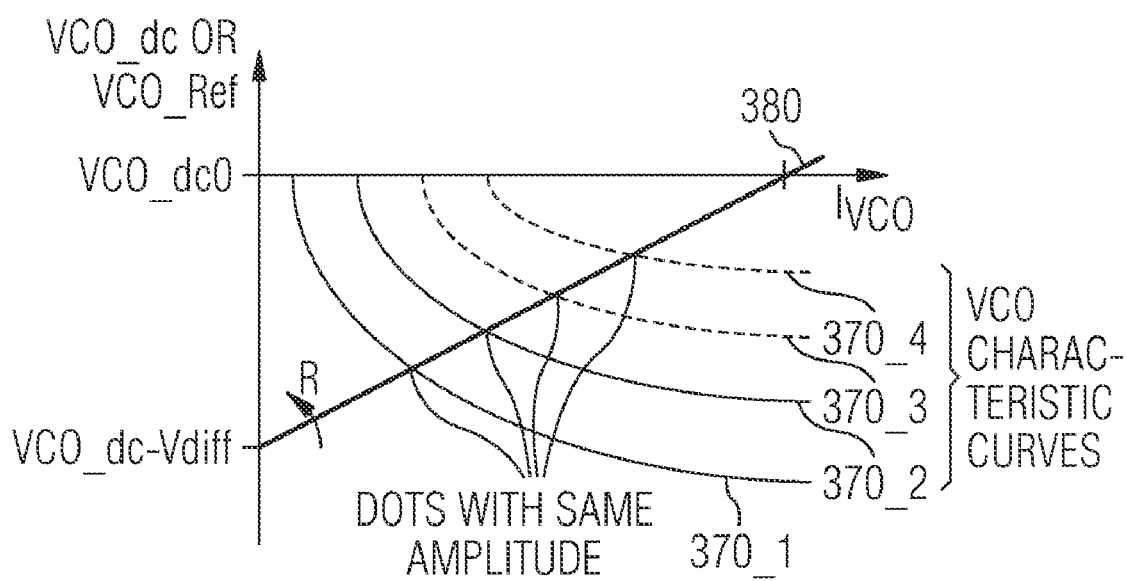

AMPLITUDE REGULATING CIRCUIT

This application claims priority from German Patent Application No. 10 2006 032 276.2, which was filed on Jul. 12, 2006, and is incorporated herein by reference in its entirety.

TECHNICAL FIELD

The present invention relates to an amplitude regulating circuit, in particular an amplitude regulating circuit for an oscillator, which may, for example, be a voltage-controlled oscillator (VCO).

BACKGROUND

Nowadays, radio frequency switching circuits or RF switching circuits are implemented in many electronic apparatuses and utilized, for example, as clock generators or basic frequency generators for receiving and/or transmitting units for data transfer by radio. Respective radio frequency switching circuits are employed both in mobile apparatuses and in apparatuses, which tend to be used in the non-mobile field. Examples of respective mobile apparatuses are portable mini-computers such as PDAs (PDA=personal data assistant) or cell phones.

Frequently, fully integrated phase-locked circuits or PLL circuits (PLL=phase-locked loop) are realized in the respective RF switching circuits. Often, the core of such a phase-locked circuit is a voltage-controlled oscillator or VCO, which is dimensioned such that it tolerates scatterings regarding the frequency, which may occur, for example, as a result of productional and/or operational parameters (temperature variations or variations in the supply voltage), and still constantly generates the desired frequency. Next to balancing the scattering due to production, temperature and supply voltage, the VCO or the corresponding RF switching circuit must also often cope with various frequency bands, which is why an integrated VCO must generally be controllable across a large frequency range. Therefore, the VCO tolerates these scatterings and is capable of balancing the (current) frequency such, with the aid of adjustable components (tuning components), that in the end it will generate the correct frequency.

With voltage-controlled oscillators covering a large frequency and temperature range, it is therefore advisable to pay particular attention to an amplitude of an oscillation provided by the voltage-controlled oscillator (output amplitude) as same basically largely depends on the respective operating conditions. In order to ensure safe functioning of the overall circuit it is therefore generally necessary that the output amplitude or amplitude be large enough to be able to drive subsequent circuits. At the same time, in a corresponding design of the respective RF switching circuit, it must be taken into consideration that often only a limited amount of energy is available for the operation of the respective IC (IC=integrated circuit). This particularly applies to mobile applications, in which battery-powered or accumulator-powered ICs are often employed. In order to maximize the battery or accumulator lifetime, it is therefore advisable to provide a minimum amount of current for the operation of the respective RF switching circuit, which may lead to significant limitation of the specified parameters of the RF switching circuit.

SUMMARY OF THE INVENTION

According to an embodiment of the present invention, an amplitude regulating circuit for an oscillator with an input for a supply signal having an electrical quantity depending on an amplitude of an oscillation of the oscillator comprises a supply circuit with a control input for a first control signal and a supply output for the supply signal based on the first control signal, a reference circuit with an input for a reference supply signal having a reference quantity, a reference supply circuit with a reference control input for a second control signal and a reference supply output for the reference supply signal based on the second control signal, and a comparator circuit with a first input coupled to the supply output, a second input coupled to the reference supply output, a first control signal output for the first control signal based on the electrical quantity and the electrical reference quantity coupled to the control input, and a second control signal output for the second control signal based on the electrical quantity and the electrical reference quantity coupled to the reference control signal input.

According to an embodiment of the present invention, an amplitude regulating circuit for a voltage-controlled oscillator with an input for a supply current having a voltage value depending on an amplitude of an oscillation of the voltage-controlled oscillator, comprises a supply circuit with a control input for a first control signal and a supply output for the supply current based on the first control signal, a reference circuit with an input for a reference supply current and a resistive element coupled to the input of the reference circuit, a reference supply circuit with a reference control input for a second control signal and a reference supply output for the reference supply current based on the second control signal and a comparator circuit with a comparator circuit and a voltage source, one output of the comparator circuit being coupled to the control input of the supply circuit and/or the reference control input of the reference control circuit, the input of the oscillator being connected to a non-inverting input of the comparator circuit 320, and the input of the reference circuit being coupled to a first terminal of the voltage source and a second terminal of the voltage source being coupled to an inverting input of the comparator circuit.

According to an embodiment of the present invention, an amplitude regulating circuit for an oscillator with an input for a supply signal having an electrical quantity depending on an amplitude of an oscillation of the oscillator comprises supply means for providing the supply signal based on a control signal, reference means for a reference supply signal having an electrical reference quantity, reference supply means for providing the reference signal based on the control signal, and comparison means for comparing the electrical quantity to the electrical reference quantity and for providing the control signal based on the comparison of the electrical quantity with the electrical reference quantity.

According to an embodiment of the present invention, a method for regulating an amplitude of an oscillation of an oscillator with an input for a supply signal having an electrical quantity depending on an amplitude of the oscillation of the oscillator and with a reference circuit with an input for a reference supply signal having an electrical reference quantity comprises a step of comparing the electrical quantity with the electrical reference quantity in order to obtain a comparison result, and a step for providing the supply signal and the reference supply signal based on the comparison result.

BRIEF DESCRIPTION OF THE DRAWINGS

Embodiments of the present invention will be detailed subsequently referring to the appended drawings, in which:

FIG. 5 is a representation of a characteristic curve field of a voltage-controlled oscillator;

DETAILED DESCRIPTION OF ILLUSTRATIVE EMBODIMENTS

Figure 1:
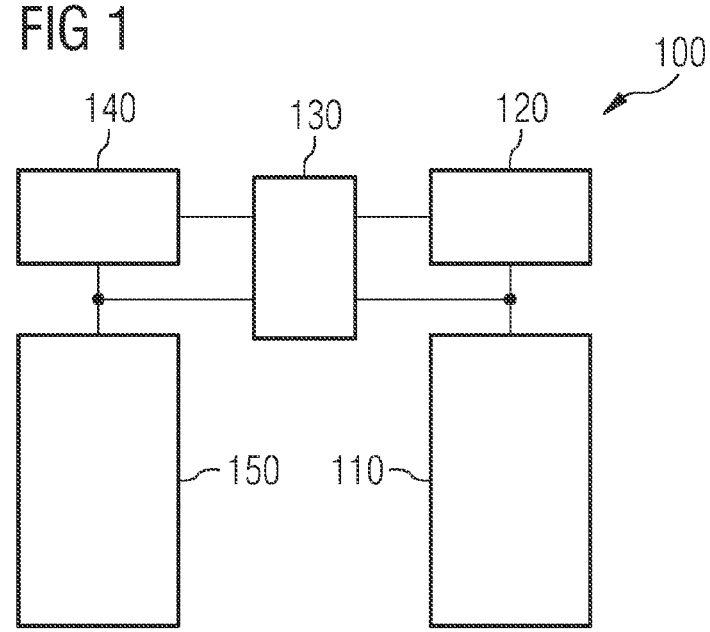
FIG. 1 is a block diagram of a first embodiment of an amplitude regulating circuit.
Figure 2:
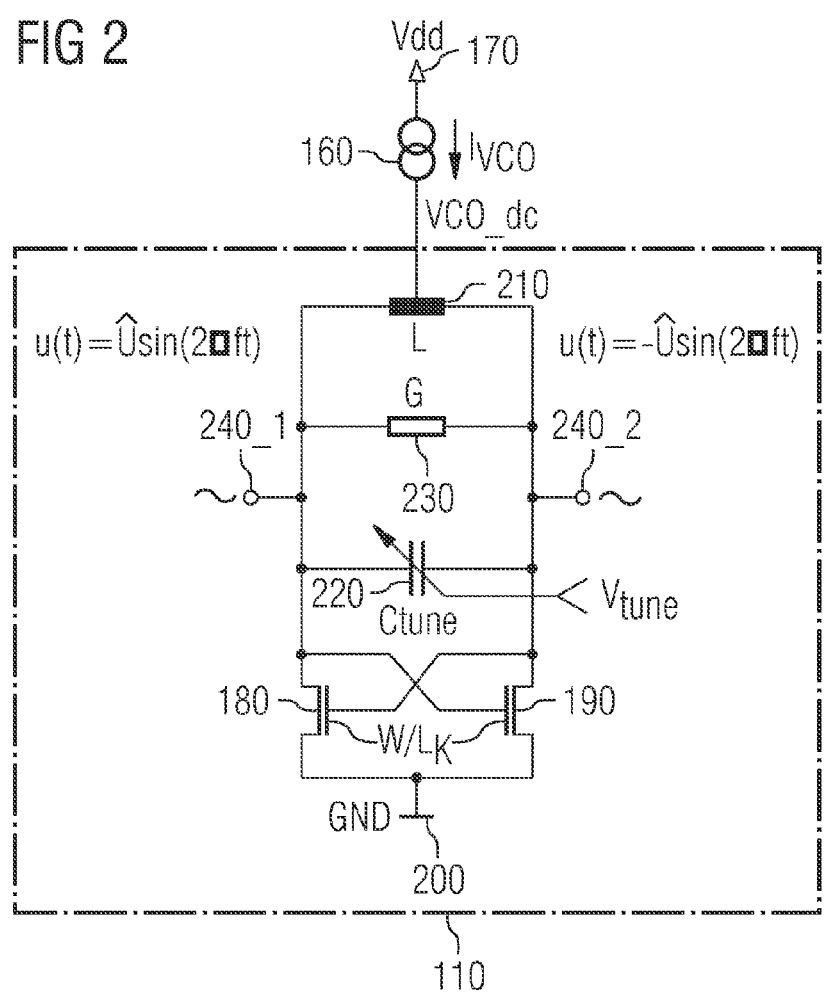
FIG. 2 is an equivalent circuit diagram of a voltage-controlled oscillator.
Figure 3A:
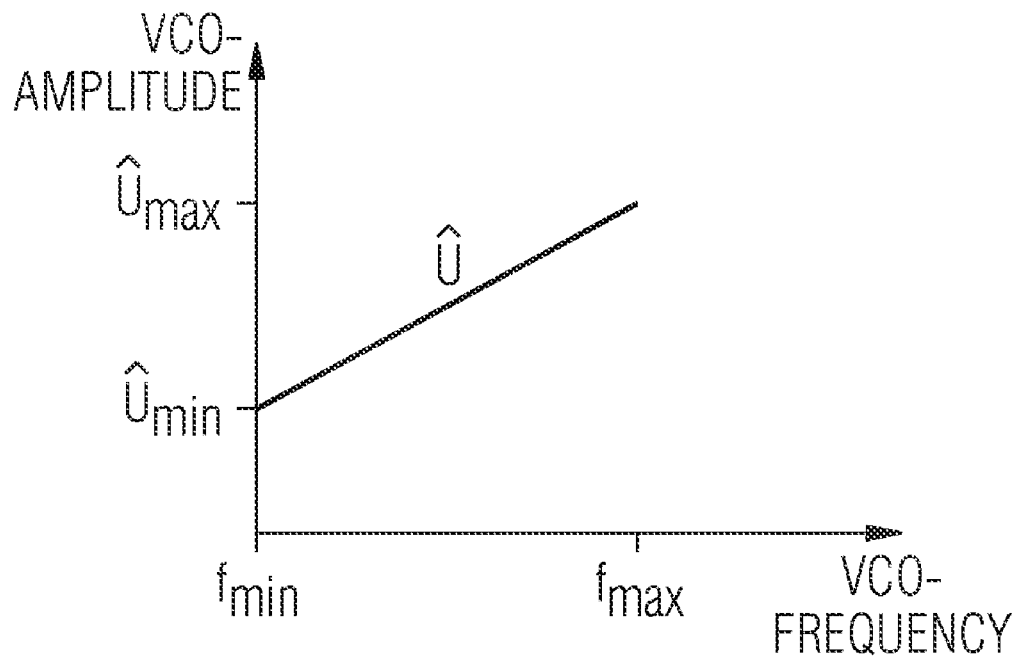
FIG. 3a shows a dependence of an amplitude of a frequency signal of a voltage-controlled oscillator in dependence on a frequency.
Figure 3B:
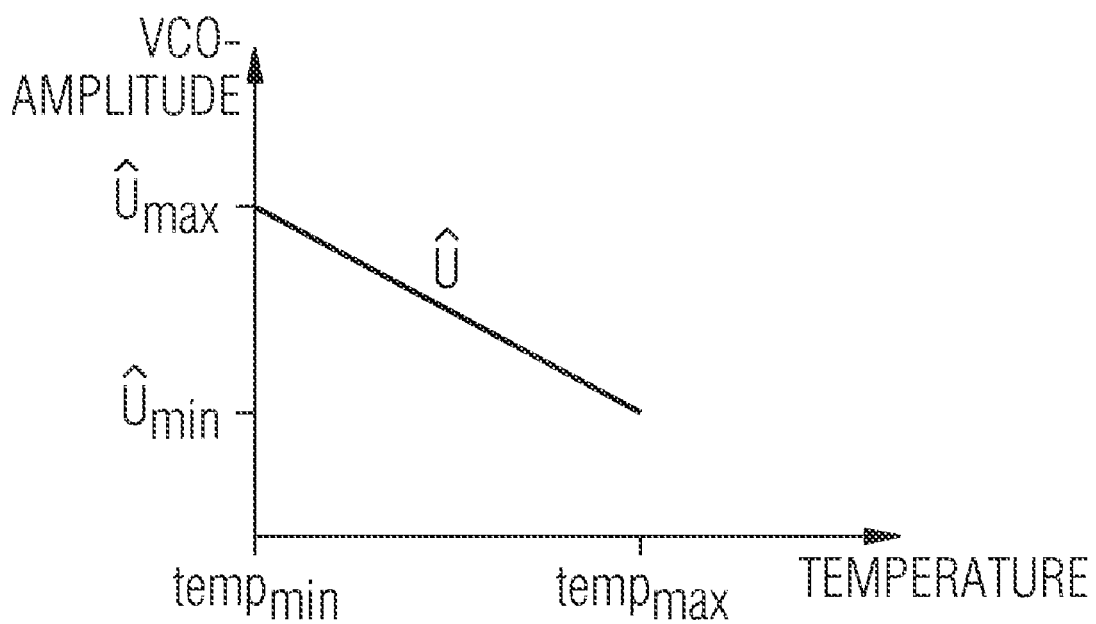
FIG. 3b shows a dependence of an amplitude of the frequency signal of a voltage-controlled oscillator in dependence on the temperature.

Before in the further course of the present application further embodiments of the present invention in the form of amplitude regulating circuits are discussed with respect to FIGS. 4-6b, first, a first embodiment of an amplitude regulating circuit is discussed with respect to FIG. 1, and a structure of a typical voltage-controlled oscillator is discussed in greater detail with respect to FIGS. 2, 3a, and 3b.

FIG. 1 shows a block diagram of a first embodiment of the present invention in the form of an amplitude regulating circuit 100 for an oscillator 110 with an input for a supply signal. The oscillator 110 may, for example, be a voltage-controlled oscillator (VCO) or another type of oscillator, which can be controlled or regulated at least with respect to one amplitude of a frequency signal output thereby. A supply output of a supply circuit 120 is connected to the input for the supply signal of the oscillator 110. In addition to the supply output, the supply circuit 120 also comprises a control input coupled to a first control signal output of a comparator circuit 130. In addition, a first input for the supply signal of the comparator circuit 130 is coupled to an input of the oscillator and the supply output of the supply circuit 120.

Moreover, the comparator circuit 130 is coupled to a reference supply circuit 140 via a second control signal output and a second input. More precisely, a reference control input of the reference supply circuit 140 is coupled to the second control signal output of the comparator circuit 130. In addition, the reference supply circuit 140 moreover comprises a reference supply output coupled to the second input of the comparator circuit 130. Moreover, an input of a reference circuit 150 is coupled to the reference supply output of the reference supply circuit 140.

In the context of the present invention, a coupling of two components means a direct or indirect connection of the respective components, for example, via one or more further electrical switching elements.

The supply circuit 120 provides to the oscillator 110 a supply signal having an electrical quantity, i.e., for example, a current value or a voltage value depending on an amplitude of an oscillation of the oscillator 110. The supply signal is also provided to the comparator circuit 130 via the first input thereof.

In a quasi mirror-inverted manner with respect to the supply circuit 120 and the oscillator 110, the reference supply circuit 140 provides to the reference circuit 150 a reference supply signal, which is also provided to the comparator circuit 130 via the second input.

Here, the reference supply signal also comprises an electrical reference quantity, which again may be a current value or a voltage value. On the basis of the electrical quantity of the supply signal and the electrical reference quantity of the reference supply signal, the comparator circuit 130 now generates a first control signal and a second control signal, which are provided to the two supply circuits, more precisely, to the supply circuit 120 and the reference supply circuit 140, via their control signal input and reference control signal input respectively.

Via the supply signal, the supply circuit 120 provides an energy necessitated for the oscillation to the oscillator 110. If, for example, a certain amount of energy is drawn off the oscillator 110 in each oscillation or during each period of an oscillation via an output not shown in FIG. 1 for a frequency signal generated by the oscillator 110 comprising the respective oscillation, and by a circuit also not shown in FIG. 1, same can be re-supplied to the oscillator 110 via the supply signal of the supply circuit 120. Moreover, energy losses resulting from internal losses of the oscillator 110 may also be compensated for via the supply signal.

The oscillator 110 is configured such or comprises the feature that the electrical quantity of the supply signal, i.e., for example, a voltage value or a current value of the supply signal, is dependent on the amplitude of the oscillation of the oscillator 110. If the supply signal provided to the oscillator 110 is, for example, a current, the oscillator 110 may be configured or designed such that a voltage value at its input depends on the amplitude of the oscillation. In this case, the voltage value of the current acting as the supply signal is the electrical quantity of the supply signal. Analogously, in the case of an oscillator 110 to which a voltage is provided, i.e. in which the supply signal represents an electrical voltage, a current value may indicate the amplitude of the oscillation of the oscillator 110.

The reference circuit 150 and the reference supply circuit 140 are commonly configured such that same enable a regulation of the supply circuit 120 and the oscillator 110 via the comparator circuit 130, without the oscillator 110 being loaded at its output not shown in FIG. 1. In other words, the reference supply circuit 140 and the reference circuit 150 are adapted to the oscillator 110 and the supply circuit 120 with respect to a characteristic quantity such as a voltage curve or current curve. Still in other words, a stable reference quantity is generated by means of the reference circuit 150, by which the amplitude of the oscillation, for example, the VCO amplitude, is determined with no load applied.

The comparator circuit 130 drives the two supply circuits 120, 140 based on the supply signal and the reference supply signal such that a (quasi) constant oscillation amplitude of the oscillator 110 across a large temperature range is achieved. If, moreover, the oscillator 110 is an oscillator with a variable frequency, for example, a voltage-controlled oscillator or VCO, the embodiment of an amplitude regulating circuit shown in FIG. 1 may guarantee a (quasi) constant oscillation amplitude of the VCO 110 as a whole across a large frequency and temperature range.

One advantage of an embodiment of the present invention is the fact that the amplitude of the oscillator 110 may be controlled and regulated without having to load the output of the oscillator 110 by a measurement of the amplitude. Therefore, the embodiment of the present invention enables a regulation of the amplitude of the oscillator 110, wherein no load must be placed on the output of the oscillator 110. This makes it possible to operate the oscillator 110 in a particularly energy-saving mode of operation, as a change of the amplitude of the oscillation provided by the oscillator in the form of a frequency signal may be compensated for by operational parameters such as the frequency of the oscillator 110 or by environmental influences such as the temperature or the supply voltage.

This makes it possible to configure the oscillator 110 such that the amplitude of the oscillation may be optimally adjusted to the requirements of the subsequent switching elements. It is therefore no longer necessary to operate the oscillator 110, among all (specified) operating conditions, in a mode of operation guaranteeing a lower limiting value of the amplitude of the oscillation, which in general results in an excessive amplitude of the oscillation compared to the lower limiting value and, therefore, in excessive energy consumption of the oscillator 110.

This is achieved by connecting a reference circuit 150 "in parallel" or "in a mirror-inverted manner" to the oscillator 110 on the supply side, the reference circuit 150, together with the reference supply circuit 140, being adapted thereto with respect to a characteristic quantity of the oscillator 110 and the supply circuit 120 so that the reference circuit 150 provides a stable reference quantity, based on which the comparator circuit 130 may provide the two supply circuits 120, 140 with control signals.

In an embodiment of the present invention, the reference circuit thus comprises, for example, a resistive element coupled to the input of the reference circuit 150 and the reference supply signal is applied. Moreover, in a further embodiment of the present invention, the reference circuit 150 may also comprise a reference transistor being adapted to one or more transistors comprised in the oscillator 110 with regard to its dimensioning and configuration. Hereby, the reference circuit 150 is able to simulate, for example, a temperature dependence or other environmental influences of the oscillator 110, which represents a significant advantage of the respective embodiments.

A further advantage of an embodiment of the present invention is the fact that the reference circuit 150 and the reference supply circuit 140 are configured such with respect to the supply circuit 120 and the oscillator 110 that the reference supply signal and the supply signal have a predetermined ratio to each other. Thereby, the amplitude of the oscillation may be regulated very precisely if, as in the typical case, the ratio of a value of the supply signal to the value of the reference supply signal is in a range between 0.75 and 1.25 or else in a range between 0.9 and 1.1.

In the further course of the present invention the same reference numerals are used for objects, which are equal or similar in function. Sections of the description referring to objects equal or similar in function may be interchanged among the individual embodiments unless explicitly claimed otherwise.

Before further embodiments of the present invention in the form of amplitude regulating circuits are discussed in the further course of the present application, first a voltage-controlled oscillator, oscillator 110, will be discussed with respect to the equivalent circuit diagram shown in FIG. 2 and the curves of an amplitude of an oscillation of the voltage-controlled oscillator illustrated in FIGS. 3a and 3b.

Thus, FIG. 2 shows an equivalent circuit diagram of a conventional realization of a voltage-controlled oscillator 110, which may be utilized, for example, as the oscillator 110 in the embodiment shown in FIG. 1. Like the oscillator 110 in the embodiment shown in FIG. 1, the voltage-controlled oscillator or VCO 110 comprises an input for a supply signal, to which in FIG. 2 a current source 160 is connected impressing upon the VCO 110 a direct current with a current value $I_{VCO}$. In addition, the current source 160 is connected to a supply terminal 170 for a positive supply voltage Vdd.

The VCO 110 comprises a parallel oscillator circuit, which may be connected via two cross-coupled transistors 180, 190 to a terminal for a reference potential 200, which may, for example, be ground (GND) or a negative supply voltage Vss. More precisely, the (parallel) oscillator circuit comprises a coil or inductivity 210 comprising a mid-connection or mid tap the input of the oscillator 110 is coupled to. The inductivity 210 has an inductivity value L. The inductivity 210 may exist in the form of a coil or an oscillator circuit coil, a correspondingly shaped conductive trace on a chip or, for example, a semiconductor circuit such as a gyrator. Depending on the actual design of the inductivity 210, the same may also comprise a series connection of two of the above-mentioned switching elements or circuits, wherein between the two switching elements the mid tap or central tap may be implemented in the form of a node. In addition, the inductivity 210 serves to decouple the oscillation from the (direct) current source 160 as the inductivity here also represents a low-pass filter for the current source 160.

A capacity 220, which may be adjusted or trimmed with respect to its capacity value, is connected in parallel to the inductivity 210. In the VCO 110 shown in FIG. 2, the capacity 220 has a capacity value Ctune, which may be adjusted by applying a control voltage $V_{tune}$ to a control terminal of the capacity 220. A respective adjustable capacity 220, which is also referred to as Ctune trim capacity, may be realized, for example, by means of varactors or capacity diodes. A respective trim capacity may, for example, be embodied in the form of a series connection of two capacity diodes, the cathode terminals of the two capacity diodes each being connected via a node, and the node being coupled to the control terminal of the trim capacity. It may be advisable to integrate additional isolation capacitances and/or capacities connected in parallel into the trim capacity.

Moreover, in the VCO 110 shown in FIG. 2, one drain terminal of one of the two transistors 180, 190 each, which are (normally off) n-channel field-effect transistors and/or (enhancement) NMOS transistors, are shown. In addition, the two transistors 180, 190 are each connected to a reference potential terminal 200 via their source terminals. The gate terminals of the two transistors 180, 190 are connected crosswise to the respective drain terminals of the respective other transistor 180, 190. More precisely, the gate terminal of the transistor 180 is connected to the drain terminal of the transistor 190, and the gate terminal of the transistor 190 is connected to the drain terminal of the transistor 180. Here, the two field-effect transistors 180, 190 have ratios of the widths W of the channels of the two transistors to a length $L_K$ of the two channels, which are identical for both transistors 180, 190 within the production tolerances.

It should be noted here that the two NMOS transistors 180, 190 may also be replaced by npn bipolar transistors. In this case, the two NMOS transistors 180, 190 must be substituted by the two npn bipolar transistors such that the two drain terminals must be replaced by the collector terminals, the source terminals must be replaced by the emitter terminals, and the gate terminals of the NMOS transistors must be replaced by the base terminals of the npn bipolar transistors. On this basis of the n-channel field-effect transistors and the npn bipolar transistors being symmetrical, in the further course of the present application, a source terminal may be a source terminal or an emitter terminal, a drain terminal may be a drain terminal or a collector terminal, and a gate terminal may be a gate terminal or a base terminal or the respective transistor, depending on the type of transistor used.

The oscillator circuit of the VCO 110 shown in FIG. 2 in addition comprises a loss resistor 230, which is represented in FIG. 2 by its conductance G and into which, for the sake of simplification all circuit losses of the VCO 110 occurring, are integrated. Moreover, the oscillator circuit of the VCO 110 comprises two output terminals 240-1, 240-2, which are connected to a terminal of each inductivity 210, loss resistor 230, and capacity 220. During the operation of the VCO 110, a (partial) frequency signal in the form of a voltage with the voltage value u(t), may be tapped at each of the two output terminals 240-1, 240-2. Herein, the frequency signal with the voltage values:

$$u(t)=\hat{U}\cdot\sin(2\pi\cdot f\cdot t) \quad (1)$$

may be tapped at the output terminal 240-1, $\hat{U}$ being the amplitude of the oscillation, f being the frequency, t being the time, and π being the Ludolph's constant. Accordingly, a frequency signal with the voltage values:

$$u(t)=\hat{U}\cdot\sin(2\pi\cdot f\cdot t) \quad (2)$$

may be tapped for reprocessing at the second output terminal 240-2. The VCO 110 illustrated in FIG. 2 in addition enables doubling the amplitude of the frequency signal as compared to the use of only a single output terminal 240-1, 240-2 by using both output terminals 240-1, 240-2 as the output of the VCO 110 in a differential manner, wherein direct current portions, which may occur at the two output terminals 240-1, 240-2, are eliminated simultaneously.

Here, the frequency signal of the oscillator or VCO 110 has an oscillating frequency f, which is inversely proportional to the root of the product of the inductivity value L of the inductivity 210 and the capacity value C=Ctune of the adjustable capacity 220. Therefore, $$f \sim \frac{1}{\sqrt{LC}} \quad (3).$$

As for many adjustable capacities 220 their capacity values C are inversely proportional to the square of the control voltage $V_{tune}$ present at the gate terminal, i.e., as:

$$C \sim 1/v_{tune}^2 \quad (4),$$

the oscillating frequency or natural frequency of the VCO 110 results in being substantially proportional to the control voltage $V_{tune}$ in the case of an ideally controlled capacity, so that:

$$f \sim V_{tune} \quad (5).$$

Moreover, the oscillator circuit of the VCO 110 has a quality value Q or an oscillator circuit quality Q, which is essentially proportional to the root of the quotient of the inductivity value L of the inductivity 210 and the capacity value C of the capacity 220, so that:

$$Q \sim \sqrt{L/C} \quad (6).$$

Moreover, the oscillation amplitude $\hat{U}$ is essentially proportional to the square of the oscillator circuit quality Q and the current $I_{VCO}$ provided to the VCO 110 by the current source 160, so that furthermore:

$$\hat{U} \sim I_{VCO} \cdot Q^2 \quad (7).$$

Together with the equations (4) and (5), the oscillation amplitude or the amplitude of the oscillation $\hat{U}$ results in being dependent on the control voltage $V_{tune}$ of the capacity 220. More precisely, the amplitude of the oscillation $\hat{U}$ is proportional to the square of the control voltage $V_{tune}$ so that:

$$\hat{U} \sim V_{tune}^2 \quad (8).$$

If the VCO 110 is operated in a small environment of a predetermined operating point with respect to the control voltage $V_{tune}$, both the dependence of the oscillator circuit frequency or natural frequency of the VCO 110 and the amplitude of the oscillation $\hat{U}$ may be approximated by a linear approximation. In the case of relatively small frequency changes, caused by a change of the control voltage $V_{tune}$, the following approximations with respect to the natural frequency or oscillator circuit frequency or frequency f of the oscillation and with respect to the oscillation amplitude or amplitude of the oscillation $\hat{U}$ are yielded:

$$f \sim V_{tune} \quad (9)$$

$$\hat{U} \sim V_{tune} \quad (10)$$

If an operating current $I_{VCO}$ is fed to the oscillator circuit or VCO 110 by the current source 160 at the mid tap of the oscillator circuit coil or inductivity 210, a direct current potential or DC potential VCO_dc forms in dependence on the exact current value $I_{VCO}$, the DC potential being in the order of the threshold voltages of the two NMOS transistors 180, 190. The DC potential VCO_dc here has a value of VCO-dc0. If the current $I_{VCO}$ is large enough, a permanent vibration or oscillation is generated in the oscillator circuit. As soon as an oscillation is present, the voltage VCO_dc drops.

As has already been discussed in the introductory sections of the present application, the output amplitude or amplitude $\hat{U}$ of the oscillation of the VCO 110 is dependent on the frequency f, as the equation (10) has already shown. FIG. 3a thus illustrates the dependence of the VCO amplitude $\hat{U}$ of the oscillation of the VCO 110 as a function of the frequency f in a frequency range between a minimum frequency $f_{min}$ and a maximum frequency $f_{max}$. In this range of the VCO frequency, the VCO amplitude rises substantially linearly from a minimum value $\hat{U}_{min}$ to a maximum value $\hat{U}_{max}$. Here, the VCO amplitude behaviour shown in FIG. 3a is based on a constant current of the current source 160 ($I_{VCO}$=const.).

In addition, FIG. 3b illustrates the behaviour of the VCO amplitude in the case of a constant current of the current source 160 with respect to a variation of the temperature of the VCO 110, as has already been indicated in the introductory sections of the present application. If the temperature of the VCO 110 is increased from a minimum temperature value $Temp_{min}$ up to a maximum temperature value $Temp_{max}$, the VCO amplitude $\hat{U}$ falls substantially linearly from a maximum amplitude value $\hat{U}_{max}$ to a minimum VCO amplitude value $\hat{U}_{min}$. Therefore, in FIGS. 3a and 3b, the output amplitude $\hat{U}$ of the VCO 110 is represented above the frequency f and the temperature for the case that the VCO and/or the VCO core 110 has a constant current or such is impressed thereon.

With VCOs 110 covering a large frequency and temperature range, it is therefore advisable to pay special attention to the output amplitude $\hat{U}$ as same, as has been shown, strongly depends on the respective operating conditions. In the case of providing the VCO 110 with a constant current $I_{VCO}$, for a safe functioning of the overall circuit, it is mostly essential that the amplitude $\hat{U}$ be selected large enough so that the subsequent circuit may be driven with respect to all operating states within the specification. In the case of mobile and therefore energy-critical systems having integrated circuits (ICs) in particular, this is a serious problem in providing a constant current $I_{VCO}$. In order to maximize a battery lifetime or accumulator lifetime of such a battery-powered or accumulator-powered system, it has so far been essential to limit the specified operating range of the VCO 110 so that the amount of current or energy necessitated to maintain a minimum oscillation amplitude is not too large. In other words, the precision or stability of the oscillation amplitude determines the optimal efficiency of the battery energy or accumulator energy in the case of charging the VCO 110 with a constant current.

Figure 4:
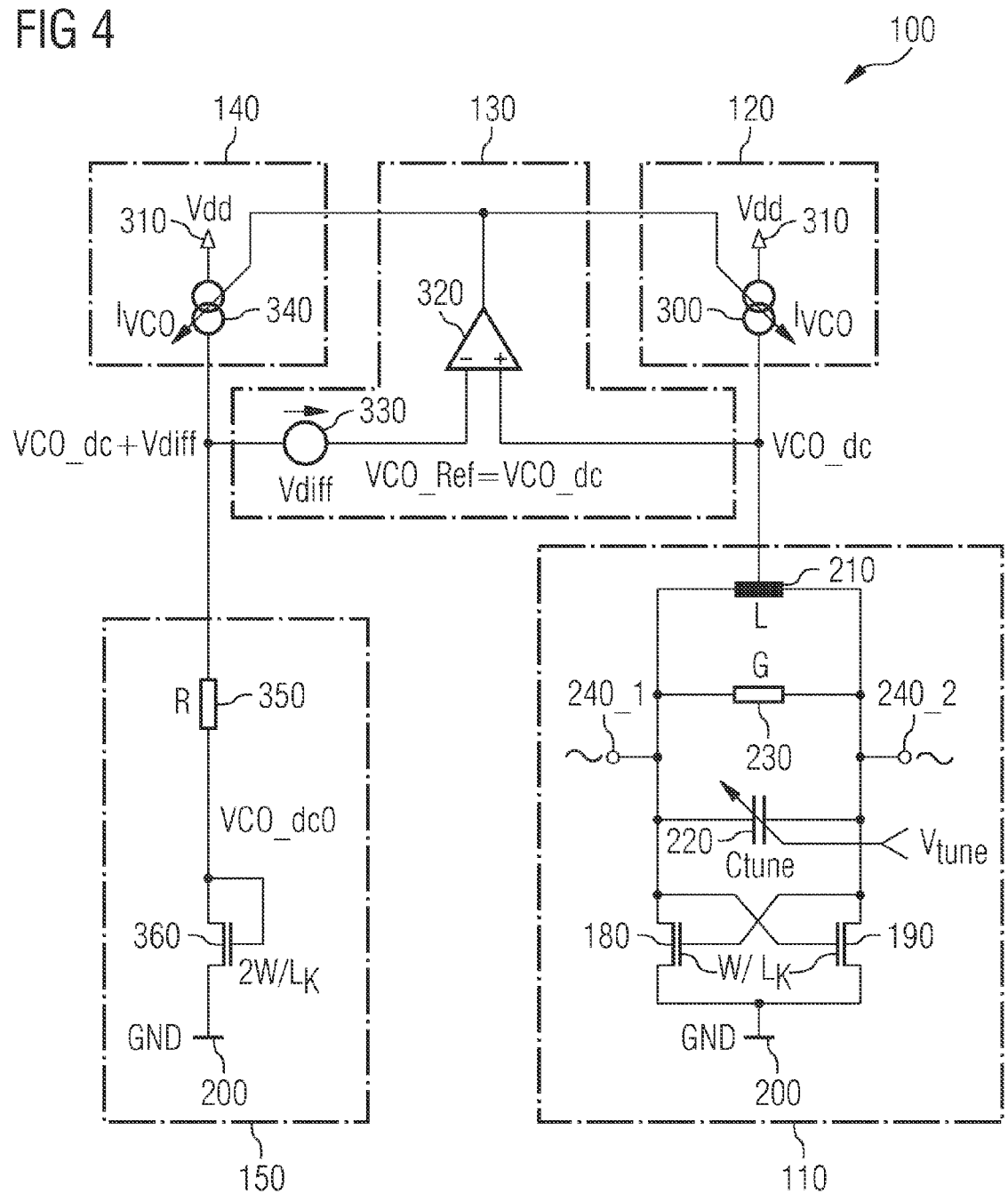
FIG. 4 is an equivalent circuit diagram of an embodiment of an amplitude regulating circuit.

FIG. 4 shows a further embodiment of the present invention in the form of an amplitude regulating circuit 100 with a voltage-controlled oscillator or VCO 110 having a structure that has already been discussed in the context of the VCO 110 in FIG. 2. For this reason, please refer to the respective sections of the present specification with respect to the VCO 110 in the context of FIG. 2. The VCO or oscillator 110 also has an input for a supply signal being provided by a supply circuit 120 with a supply signal output. Here, the supply circuit 120 comprises a controllable or regulatable current source 300 which is connected to the supply signal output of the supply circuit 120 on the one hand and to a supply voltage terminal 310 providing a positive supply voltage Vdd to the current source 300 on the other hand. The current source 300, in addition comprises a control input coupled to a control input of the supply circuit 120 and further to a first control signal output of a comparator circuit 130.

Analogously to the embodiment shown in FIG. 1, in the amplitude regulating circuit 100 shown in FIG. 2, the input of the VCO 110 and the supply output of the supply circuit 120 are also coupled to a first input of the comparator circuit 130. The same is connected to a non-inverting input of a comparator circuit 320, which comprises the comparator circuit 130. The comparator circuit 320 also comprises an output which is connected to the first control signal output of the comparator circuit 130 and therefore to the control input of the current source 300. An inverting input of the comparator circuit 320 is connected to a second input of the comparator circuit 130 via a voltage source 330 providing a (constant) voltage value $V_{diff}$.

As in the embodiment shown in FIG. 1, the second input of the comparator circuit 130 is coupled to a reference supply output of a reference supply circuit 140. Like the supply circuit 120, the reference supply circuit 140 also comprises a controllable or regulatable current source 340, which is coupled to the reference supply output of the reference supply circuit 140 on the one hand and to a supply voltage terminal 310 providing a positive supply voltage Vdd to the current source 340 on the other hand. Furthermore, the current source 340 has a control input which is connected to the output of the comparator circuit 320 via the reference control input of the reference supply circuit 140 and the second control signal output of the comparator circuit 130.

As the embodiment of the present invention shown in FIG. 1 has already shown, in the embodiment in the form of an amplitude regulating circuit 100 also shown in FIG. 4, the reference supply circuit 140 is connected via the reference supply output to a reference circuit 150 comprising a series connection of a resistive element 350 with a resistance value R and a transistor 360. More precisely, the resistive element 350 is connected to an input of the reference circuit on the one hand and to a drain terminal of the transistor 360 on the other hand. A source terminal of the transistor 360 is further connected to a reference potential terminal 200. A gate input of the transistor 360 is also connected to the drain terminal of the transistor and therefore to the resistive element 350.

As has already been discussed in connection with the two transistors 180, 190 of the VCO 110, the transistor 360 shown in FIG. 4 may be, just like the transistors 180, 190, an n-channel field-effect transistor such as an NMOS transistor or an npn bipolar transistor. In FIG. 4, the three transistors 180, 190, and 360 are each plotted as (normally off) n-channel field-effect transistors, the two field-effect transistors 180, 190 having an identical ratio of the channel width W to the channel length $L_K$ to an extent possible in the production process. In this case, the transistor 360 has a ratio of channel width to channel length double the ratio of the two transistors 180, 190. In other words, the transistor 360 has a ratio of channel width to channel length of 2 $W/L_K$.

FIG. 4 therefore shows an embodiment of an amplitude regulating circuit 100 for an oscillator in the form of a VCO 110 or a VCO core 110, which for amplitude regulation is coupled to a regulation comprising the supply circuit 120, the comparator circuit 130, and the reference supply circuit 140. The reference supply circuit 140 is, as has been discussed, connected to the reference circuit 150.

Therefore, the amplitude regulating circuit 100 for an oscillator 110, represented in FIG. 4, offers the possibility of a regulation maintaining on a constant level the oscillation amplitude or amplitude of the oscillator 110 across a large operating range of the VCO 110 and does not load the VCO signal or frequency signal, which may be tapped via one or both of the output terminals 240-1, 240-2 of the VCO 110. The fact that there is no load on the VCO signal due to the amplitude regulating circuit 100 is an important advantage of the present embodiment, especially in the case of high frequencies. Depending on the concrete implementation or terms of reference, the missing of a load on the output of the VCO is particularly advantageous with frequencies above the typical 10 MHz. With modern technologies in particular, this advantage explicitly shows in frequencies of approx. 500 MHz and more.

A further advantage of the present embodiment of an amplitude regulating circuit 100 is the fact that a high degree of regulation accuracy regarding the amplitude regulation may be achieved. This accuracy, which may also be referred to as matching, is achieved by generating the reference quantity for the regulation by means of the reference circuit 150, which in the embodiment shown in FIG. 4 is constructed similar to the VCO or VCO core 110 and has the same current density as far as the transistors 180, 190, and 360 are concerned.

As has already been explained in connection with FIG. 4, the regulation or the amplitude regulating circuit 100 for a VCO 110 comprising a cross-coupled pair of NMOS transistors 180, 190, and a parallel oscillator circuit is represented. This oscillator circuit comprises an inductivity or coil 210 with an inductivity value L, a controllable capacity 220 comprising one or more varactors or trim capacitances, and comprising a capacitance value Ctune, and a loss resistor 230, which is in turn represented in FIG. 4 by its reference value G. For the sake of simplification, all circuit losses of the VCO core 110 occurring are combined in this loss resistor 230. The operating current $I_{VCO}$ provided by the supply circuit 120 is fed at the mid tap or central tap of the oscillator circuit coil 210.

Here, a direct current potential or DC potential with a value VCO_dc in the order of the threshold voltages of the normally-off NMOS transistors 180, 190 is created in dependence on the exact current value $I_{VCO}$. If the current $I_{VCO}$ is large enough, i.e., if it exceeds a value typical for the concrete implementation, a permanent oscillation is generated in the oscillator circuit. As soon as this oscillation is present, the voltage VCO_dc at the mid tap of the inductivity 120 drops in dependence on the amplitude of the oscillation. This tapping of the voltage VCO_dc may amount to up to 1 V, typically up to 200 mV and is the crucial point for the regulation of the amplitude of the oscillation of the VCO 110. The voltage at the mid tap of the inductivity 210, before the oscillation in the parallel oscillator circuit of the VCO 110 begins, is referred to as the voltage VCO_dc0.

In the embodiment of an amplitude regulating circuit shown in FIG. 4, therefore, the current $I_{VCO}$ represents the supply signal, which is provided to the oscillator 110 by the supply circuit 120. As has already been explained, the supply signal in the embodiment shown in FIG. 4 has a voltage value VCO_dc, which depends on the amplitude of the oscillation of the oscillator 110. Thus, the voltage value of the supply current represents the electrical quantity of the supply signal in the amplitude regulating circuit 100 shown in FIG. 4.

The regulation of the embodiment of an amplitude regulating circuit 100 illustrated in FIG. 4 is based on comparing the decreased voltage VCO_dc at the VCO 110, present at the input of the VCO 110 in the case of an oscillation, to a reference voltage VCO_Ref, which is generated at least partially in the reference cell or reference circuit 150.

As has already been explained, the reference circuit 150 comprises one or more NMOS transistors 360 which are, within the limits of the production tolerances that may be achieved, identical to the transistors 180, 190 of the VCO 110 and therefore have the same current density as the VCO core 110. The transistor 360 may be realized both as a single transistor and a parallel connection of two transistors. If the transistors 180, 190, and 360 are, as is illustrated in FIG. 4, (normally off) NMOS transistors, the two transistors 180, 190 each having a channel width W and a channel length $L_K$, the transistor 360 may be constructed out of two transistors identical to the transistors 180, 190 in the case of a parallel connection of two transistors. In other words, the transistor 360 may be embodied in the form of a parallel connection of two transistors having a ratio of channel width to channel length of $W/L_K$. If, however, the transistor 360 is embodied as a single transistor, it should have a ratio of channel width to length of $2 W/L_K$ in order to achieve a current density that is substantially identical to the VCO core 110. This configuration of the transistor 360 also provides conditions in the reference circuit 150 similar to those in the VCO 110.

The necessitated maximum voltage drop $V_{diff}$, which may occur at the mid tap of the inductivity 210 and/or the input of the VCO 110 with respect to the voltage value VCO_dc0, represents a constant voltage value and is represented and/or realized by a voltage source 330 of the comparator circuit 130 in the embodiment of an amplitude regulating circuit 100 shown in FIG. 4. In order to achieve a constant amplitude of the oscillation of the oscillator 110, it does not suffice to simply provide the voltage drop $V_{diff}$ caused by the voltage source 330, but the resistive element 350 with the resistance value R, also referred to as the matching resistance, is also necessitated. The resistor or resistive element 350 adjusts the amplitude curve across the operating range of the VCO 110, as will be explained further on. Therefore, a voltage value VCO_Ref having a value (VCO_dc+$V_{diff}$) appears at the input of the reference circuit 150 and/or at the reference supply output of the reference supply circuit 140 in the operation of the VCO 110.

In other words, the regulation realized in the context of the VCO amplitude regulation by the supply circuit 120, the reference supply circuit 140, and the comparator circuit 130 makes sure that the voltages at the inverting and non-inverting inputs of the comparator circuit 320 are identical. If, as is illustrated in FIG. 4, the voltage provided at the inverting input of the comparator circuit 320 is referred to as VCO_Ref, and if the voltage VCO_dc is applied at the non-inverting input of the comparator circuit 320 based on the connection of the comparator circuit 130 in the embodiment represented in FIG. 4, the regulation yields an equality within the typical accuracies of a respective comparator circuit 320, so that the relation $$VCO\_ref = VCO\_dc \quad (11)$$

is valid.

Thus, FIG. 5 shows a plot of a VCO characteristic curve field with four VCO characteristic curves 370-1, 370-2, 370-3, and 370-4, which are exemplarily selected from the VCO characteristic curve field. In FIG. 5, the current value $I_{VCO}$ provided by the current source 300 of the supply circuit 120 is plotted on the abscissa. On the ordinate of the plot represented in FIG. 5, the voltage VCO_dc appearing at the input of the oscillator or VCO 110 is plotted, the voltage VCO_dc being, due to the regulation realized by the comparator circuit 130, identical to the reference voltage VCO_Ref.

The VCO characteristic curves 370-1 to 370-4 represented in FIG. 5, differ from one another, like the VCO characteristic curve not shown in FIG. 5, which may be located in between the four curves represented, in that they depend on further parameters. As has already been discussed in connection with FIGS. 3a and 3b, these comprise not least the temperature and the frequency of the oscillation of the VCO 110 caused by the change of the controllable capacity 220. Thus, the VCO characteristic curve 370-1, for example, corresponds to a low temperature and/or a high frequency with respect to a medium temperature and a medium frequency of the VCO 110. In contrast to that, the VCO characteristic curve 370-4 relates to a high temperature and a low frequency.

Furthermore, to each characteristic curve, i.e. to each operating state of the VCO 110, which is characterized not least by the temperature of the VCO and the frequency realized by the adjustable capacity 220, an amplitude of the oscillation of the VCO 110 is allocated. In the plot chosen in FIG. 5, dots having a substantially identical or equal amplitude are arranged on one or more straight lines. A corresponding reference straight line 380 is drawn in FIG. 5. Based on this property of the plot represented in FIG. 5 and the properties of the VCO 110 or the oscillator 110, the intersection points of the reference straight line 380 and the characteristic curves 370-1 to 370-4 correspond to dots with (essentially) the same amplitude of the oscillation of the VCO 110 for different operating parameters of the oscillator, i.e., for different temperatures and frequencies. Such a reference straight line 380 may, for example, be obtained by a (numerical) fit of a respective VCO characteristic curve field.

The reference straight line 380 thus obtained, may now be simulated and/or implemented in terms of circuit engineering with respect to the embodiment of an amplitude regulation circuit 100 shown in FIG. 4, by correspondingly adapting on the one hand the voltage value $V_{diff}$ of the voltage source 330 and on the other hand and the resistance value R of the resistive element 350. As is indicated in FIG. 5, based on the voltage value VCO_dc0 given essentially by the transistors 180, 190, and/or transistor 360, the voltage value $V_{diff}$ of the voltage source 330 determines the intersection point of the reference straight line 380 and the ordinate of the representation shown in FIG. 5. The gradient of the reference straight line 380 is determined by the resistance value R of the resistive element 350 from the ratio of the change of the voltage value VCO_dc and the change of the current value $I_{VCO}$. While the gradient of the output voltage of the reference cell 150, which is also basically given by the reference straight line 380, is determined by the resistance value R of the resistive element 350, the absolute level of the output voltage of the reference cell 150 is determined by the voltage value $V_{diff}$ of the voltage source 330 and the voltage VCO_dc0, which is given by the threshold voltages of the transistors 180, 190, 360 involved.

Basically, thus an implementation of the transistor 360 in connection with the reference circuit 150 may be omitted if the respective voltage drop, i.e. substantially VCO_dc0, is considered in voltage provided by the voltage source 330. Nonetheless, the implementation of the transistor 360 in connection with the reference circuit 150 is advantageous in the embodiment shown in FIG. 4 through the fact alone that by the transistor 360, the voltage drop VCO_dc0 caused by the transistors 180, 190 of the VCO 110 is simulated. This is true independently of the respective operating conditions, i.e., independently in particular of the temperature the VCO 110 is exposed to. In other words, one particular advantage of the embodiment shown in FIG. 4 is the fact that the voltage source 330 must not take into consideration possible temperature influences on the voltage VCO_dc0.

A method for adapting the voltage value $V_{diff}$ of the voltage source 330 and for dimensioning the resistance value R of the resistive element 350 therefore comprises:

1. Determining a VCO characteristic curve field by measuring an amplitude of an oscillation of the VCO 110 and the voltage VCO_dc appearing at the input of the oscillator 110 in dependence on the current $I_{VCO}$ impressed at the input of the oscillator 110 and other operating parameters such as the temperature and/or the frequency of the oscillator 110, as far as the latter is controllable and/or adjustable.

2. Determining a reference straight line 380 by a (numerical) approximation of the VCO characteristic curve field.

3. Determining a resistance value R for the resistive element 350 and the voltage value $V_{diff}$ of the voltage source 330, possibly in consideration of the voltage value VCO_dc0 of the offset voltage or the zero point voltage or zero oscillation voltage caused by the two transistors 180, 190 of the oscillator 110 by means of the gradient of the reference straight line 380 and the intercept and/or the absolute term of the mathematical representation of the reference straight line 380.

4. Configuring or trimming the resistive element 350 and the voltage source 330 so that same comprise the resistance value R and the voltage value $V_{diff}$.

Depending on the accuracy necessitated, the last point in particular of the method described above may be carried out in advance for a complete series production, wherein in this case the obtainable accuracy of the amplitude regulation falls short of individual trimming of single oscillators 110 and their amplitude regulating circuits 100 for the benefit of simpler and faster production and therefore less production costs. In this case, the voltage source 330 and the resistive element 350 may be designed such as early as during the dimensioning and configuring of the amplitude regulation that same nominally and/or in the production series average have the voltage value $V_{diff}$ and the resistance value R.

Alternatively or in addition, for example, in order to achieve higher accuracy of the amplitude regulation, an amplitude regulating circuit 100 and/or the entire integrated circuit, which comprises the oscillator 110 and the amplitude regulating circuit 100, may be adjusted to values as optimal as possible by a conditioning and/or trimming process. In this case, the resistive element 350 would be adjusted with respect to its resistance value R during fourth step of the above method, for example, by means of a doping step, a change in a width of a conductive trace of the resistive element 350, or any other process by which an electrical resistance value of a resistive element, produced, for example, in semiconductor technology, may be influenced. Exemplarily, a resistive semiconductor element on the basis of a polysilicon layer may be embodied, which may be adapted with respect to its width by the use of an etching process and/or radiation by means of a laser or a focusing ion beam. Hereby, the concrete resistance value R of the resistive element 350 may be adapted to the VCO characteristic curves 370-1 to 370-4, which in this instance are experimental.

The same applies to the voltage source 330 that may be realized, for example, by providing the same by means of a voltage divider, relating to an external supply voltage. Hereby, the problem of an adjustable voltage source 330 is also traced back to adjusting or trimming resistive elements, as has been discussed above.

In FIG. 5, therefore, the curve of the reference voltage VCO_Ref is illustrated in the form of the reference straight line 380 above the current $I_{VCO}$ of the current source 300. Therefore, based on the amplitude regulation, the following connection is yielded for the reference voltage VCO_Ref in the steady state of the VCO 110:

$$\text{VCO\_Ref} = \text{VCO\_dc0} + R \cdot I_{VCO} - V_{diff} = \text{VCO\_dc} \quad (12).$$

Here, as has been discussed above, the VCO_dc0 is the voltage forming at the NMOS transistor(s) 180, 190, 360 when the current $I_{VCO}$ passes through them and there is no oscillation present at the output terminals 240-1, 240-2 of the VCO 110.

In addition, in FIG. 5, the characteristic curve field is illustrated with four exemplary VCO characteristic curves 370-1 to 370-4 of the VCO 110 for various operating ranges. The intersection points of the characteristic curve field with the reference straight line 380 yield the operating points of the regulation, which adjust in a stable manner depending on the respective load. This is feasible as the dots for a constant amplitude are situated approximately on a straight line in the VCO characteristic curve field. It is therefore possible to operate with a reference circuit 150, as is shown by the embodiment illustrated in FIG. 4, and to design the regulation correspondingly by means of respective dimensioning of the switching elements involved.

The regulation in the embodiment shown in FIG. 4 can therefore be changed via two quantities, once via the resistance value R of the resistive element 350 and then via the constant voltage value $V_{diff}$ of the voltage source 330. Therefore, the amplitude height or the amplitude and its curve may be adjusted over the respective cases of loading and maintained constant by means of the amplitude regulating circuit 100.

Figure 6A:
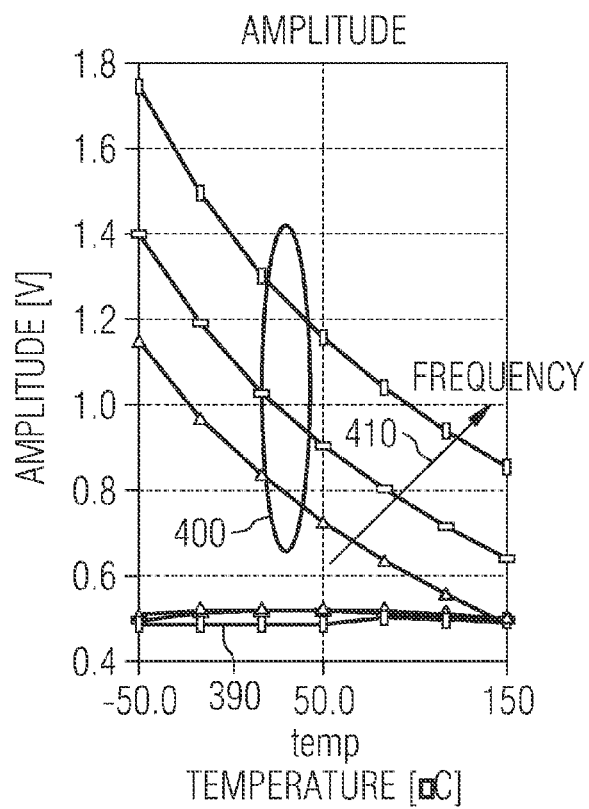
FIG. 6a shows a dependence of an amplitude on a temperature for a voltage-controlled oscillator with and without the use of an embodiment of an amplitude regulating circuit.

The function of this regulation with the help of the reference circuit 150, which is constructed substantially matching the VCO core 110, i.e. substantially has the same transistors and the same current densities at, could be operated by means of a (numerical) simulations on a realistic VCO circuit. Therefore, FIG. 6a shows a comparison of several curves of the amplitude of an oscillation as a function of the temperature in a temperature range from −50° C. to 150° C. for various frequencies, which were realized by correspondingly adjusting the capacity 220. More precisely, FIG. 6a shows the result of a corresponding simulation with respect to the amplitude above the temperature in various frequency bands, wherein the curves 390 show a flat course of approx. 500 mV in the range of the VCO amplitude adjusted in the case of the regulation enabled and/or with a regulation. In good approximation, with the help of the amplitude regulation circuit 100, the amplitude of the oscillation may be kept constant with very good accuracy in various frequency ranges in a large temperature range of 200° C. The curves 400 correspond to an operation of the VCO 110 in the case of a constant current $I_{VCO}$, i.e., an operation of the VCO 110 without regulation. Here, the curves 400 show that the amplitude strongly depends on the temperature and the frequency. In other words, the curves 400 scan a large area in the case of a constant current provision. An arrow 410 indicates the direction of a rising frequency for the curves 400.

Figure 6B:
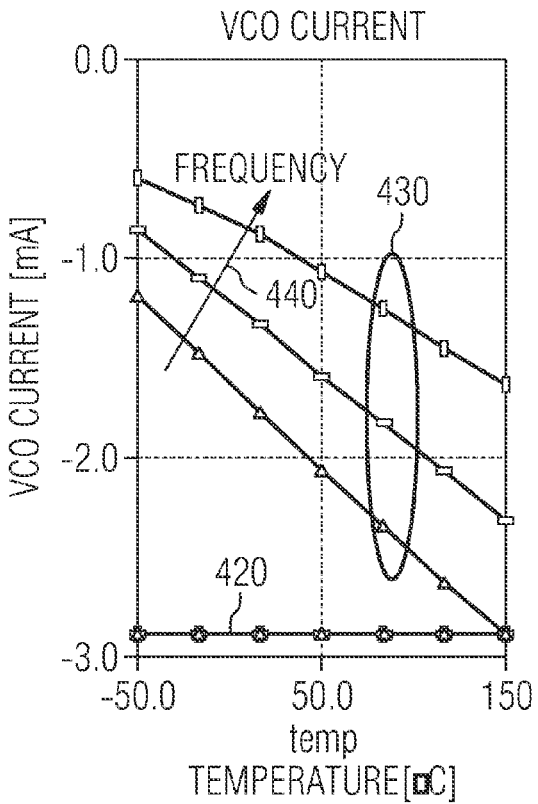
FIG. 6b shows a dependence of a supply current on a temperature for a voltage-controlled oscillator with and without the use of an embodiment of an amplitude regulating circuit.

FIG. 6b shows the resulting VCO current $I_{VCO}$ as a function of the temperature for various frequency bands for the parameters already shown in FIG. 6a. While the curves 420 shown in FIG. 6b, are based on a constant VCO current of approx. 3 mA and correspond to the amplitude curves 400 of FIG. 6a, i.e. the case of an operation of the VCO 110 without any regulation, the VCO current curves 430 relate to the case of the amplitude of the oscillation of the VCO 110 being regulated. Here, too, an arrow 440 shows the direction of the rising frequency the curves 430 are based on.

While 6a shows that the curves 400 of the amplitude without regulation significantly decrease as the temperature rises, as FIG. 3b has already shown, an embodiment of an amplitude regulating circuit makes it possible to keep the amplitude of the oscillation of the VCO 110 fixed very well across a very large temperature range of 200° C. as it may occur, for example, in the automobile industry. In contrast to that, the curves 400 drop significantly in the temperature range between −50° C. and 150° C. as the temperature rises. As, as has already been explained, the curves 400 of the amplitude correspond to the VCO current curves 420, the illustration in FIGS. 6a and 6b in addition provides a direct comparison of the energy consumption of the VCO 110 in the cases with and without regulation by the amplitude regulating circuit 100. The VCO current of approx. 3 mA, which the curves 420 also show, is rated such that the resulting amplitude of the VCO 110 does not drop to a value below approx. 500 mV with respect to the temperature and frequency in the parameter range shown in FIGS. 6a and 6b.

As the curves 390 of the amplitude correspond to the curves 430 of the VCO current, and as the curves 390 are all in the range of approx. 500 mV, resulting energy savings may be read from a direct comparison of the VCO currents with and without regulation. Therefore, although the curves 430 of the VCO current exhibit increasing current requirements as the frequency drops and the temperature rises, their magnitude will be below the current curves 420, with the only exception of the case of the lowest frequency and the highest temperature.

In other words, FIG. 6b shows that in the optimum case up to 2.2 mA may be saved with respect to the 3 mA when the amplitude is regulated to approx. 500 mV with the help of the amplitude regulating circuit 100, as in the case of low temperatures and a high frequency only approx. 600 µV or 0.6 mA are necessitated to ensure this amplitude. In other words, FIGS. 6a and 6b show that, compared to a constant current provision, an embodiment of an amplitude regulating circuit according to the present invention may significantly reduce the energy consumption or energy requirements of a VCO 110 in general. In addition, as the output of the VCO 110 in the form of the output terminals 240-1, 240-2 is not loaded in the embodiments of the present invention, which is advantageous particularly in the field of high frequencies, the embodiments of the present invention are advantageous also compared to controlled core currents with a trimming or regulation in the case of signal loading.

Embodiments of the present invention in the form of amplitude regulating circuits therefore enable an amplitude regulation for voltage-controlled oscillators with a large frequency range, which are also referred to as wide-band VCOs. A respective amplitude regulating circuit according to an embodiment of the present invention may, for example, be employed in connection with products having integrated VCOs as may be found, for example, in the field of radio transmitters and/or radio receivers that are battery-powered or accumulator-powered.

As has already been explained in the context of the discussions regarding the various embodiments of the present invention, the reference supply circuit 140 and the reference circuit 150 are adapted to the supply circuit 120 and the oscillator 110 such that a signal strength or an electrical reference quantity of the reference supply signal has a predetermined ratio to the signal strength or the electrical quantity of the supply signal. As in the embodiment shown in FIG. 4 in particular, both the reference supply signal and the supply signal are currents having respective current values, the current value of the current source 340 and the current value of the current source 300 have a predetermined ratio to each other, which is, in the embodiment shown in FIG. 4, identical currents or equal currents, as both current sources 300, 340 supply a current value $I_{VCO}$ each. This also forms the basis of the relation of the reference voltage VCO_Ref in equation (12). In the context of the present application, equal or identical currents and signal strengths are understood as ones differing from one another by not more than a typical +/−25% and advantageously not more than +/−10%.

Basically, other predetermined ratios may also be used. In the case of the embodiment shown in FIG. 4, the current source 340 of the reference supply circuit 140 may output a correspondingly smaller current value with respect to the current value of the current source 300 of the supply circuit 120, if the resistance value R of the resistive element 350 is increased to the same degree. In other words, the current of the current source 340 of the reference supply circuit 140 may be reduced as long as a voltage drop across the resistive element 350 remains substantially constant in the embodiment shown in FIG. 4. Moreover, in the case of reducing the current strength of the current source 340, the transistor 360 of the reference circuit 150, too, may be dimensioned correspondingly smaller, as long as the ratio of the channel width to the channel length corresponds to that of the parallel connection of the two transistors 180, 190 of the VCO 110. Accordingly, as a rule, the current value of the current source 340 may of course be increased, which would, however, lead to increased energy consumption of the overall circuit, which is normally not desired.

In addition, voltage sources may also be employed as the supply circuit 120 and the reference supply circuit 140 if the oscillator 110 correspondingly reacts by changing the current value at its input when the amplitude of the resulting oscillation changes.

Depending on the conditions, embodiments of the inventive method may be implemented in hardware or software. The implementation may be effected on a digital storage medium, particularly a floppy disc, CD or DVD, with electronically readable control signals, which may cooperate such with a programmable computer system that embodiments of the inventive methods are configured. In general, therefore, embodiments of the present invention also consist in a software program product or a computer program product or a program product with a program code stored on a machine-readable carrier for performing an embodiment of the inventive method if the software program product is run on a computer or a processor. In other words, an embodiment of the present invention may therefore be realized as a computer program or a software program or a program with a program code for performing an embodiment of the method if the program is run on a processor. The processor may be formed by a computer, a chip card (smart card) or any other integrated circuit.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An amplitude regulating circuit for an oscillator with an input for a supply signal comprising an electrical quantity depending on an amplitude of an oscillation of the oscillator, the amplitude regulating circuit comprising:
 a supply circuit with a control input for a first control signal and a supply output for the supply signal based on the first control signal;
 a reference circuit with an input for a reference supply signal comprising a reference quantity;
 a reference supply circuit with a reference control input for a second control signal and a reference supply output for the reference supply signal based on the second control signal; and
 a comparator circuit with a first input coupled to the supply output, a second input coupled to the reference supply output, a first control signal output for the first control signal based on the electrical quantity and the electrical reference quantity, coupled to the control input, and a second control signal output for the second control signal based on the electrical quantity and the electrical reference quantity, coupled to the reference control signal input.

2. The amplitude regulating circuit of claim 1, wherein the supply circuit comprises a controllable and/or regulatable current source and the reference supply circuit comprises a controllable and/or regulatable current source, the current source of the supply circuit being coupled to the supply output and the current source of the reference supply circuit being coupled to the reference supply output, wherein the current source of the supply circuit is adapted to provide a current as the supply signal, wherein the current source of the reference supply circuit is adapted to provide a current as the reference supply signal, wherein a voltage value being the electrical quantity of the supply signal, depends on the amplitude of the oscillation of the oscillator, and wherein the electrical reference quantity is a voltage value of the reference supply signal.

3. The amplitude regulating circuit of claim 2, wherein the reference circuit comprises a resistive element coupled to the input of the reference circuit and the reference supply signal is applied to said resistive element.

4. The amplitude regulating circuit of claim 3, wherein the reference circuit further comprises a reference transistor, one source terminal or one drain terminal of which is coupled to the input of the reference circuit.

5. The amplitude regulating circuit of claim 4, wherein the reference transistor is a field-effect transistor, the source terminal being coupled to a reference potential, the drain terminal and the gate terminal being coupled to the input of the reference circuit via the resistive element, and the field-effect transistor comprising a ratio of a width to a length of a channel so that between the source terminal and the drain terminal of the reference transistor a voltage drop corresponding to a voltage value at the input of the oscillator is present, if the oscillator is supplied with a current, as the supply signal, with a threshold current value resulting in an initialization of the oscillation.

6. The amplitude regulating circuit of claim 2, wherein the current value of the supply signal and the current value of the reference supply signal comprise a predetermined ratio to each other.

7. The amplitude regulating circuit of claim 6, wherein the predetermined ratio is a range between 0.75 and 1.25.

8. The amplitude regulating circuit of claim 1, wherein the comparator circuit comprises a comparator, an inverting input of the comparator being coupled to the second input of the comparator circuit, a non-inverting input of the comparator being coupled to the first input of the comparator circuit and an output of the comparator being coupled to at least one of the first and the second control signal outputs of the comparator circuit.

9. The amplitude regulating circuit of claim 8, wherein the comparator circuit comprises an operational amplifier or a differential amplifier circuit.

10. The amplitude regulating circuit of claim 1, wherein the comparator circuit comprises a voltage source coupled to the second input of the comparator circuit.

11. The amplitude regulating circuit of claim 1, wherein the oscillator comprises an oscillator circuit with an inductance and a capacitance.

12. The amplitude regulating circuit of claim 1, wherein the oscillator comprises a voltage-controlled oscillator with a frequency of the oscillation, the frequency being adjustable via a control voltage.

13. An amplitude regulating circuit for a voltage-controlled oscillator with an input for a supply current, wherein a voltage value present at the input depends on an amplitude of an oscillation of the voltage-controlled oscillator, the amplitude regulating circuit comprising:
 a supply circuit with a control input for a first control signal and a supply output for the supply current based on the first control signal;
 a reference circuit with an input for a reference supply current and a resistive element being coupled to the input of the reference circuit;
 a reference supply circuit with a reference control input for a second control signal and a reference supply output for the reference supply current based on the second control signal; and
 a comparator circuit with a comparator and a voltage source;
 wherein an output of the comparator circuit is input to the control input of the supply circuit and to the reference control input of the reference supply circuit;
 wherein the input of the oscillator is connected to a non-inverting input of the comparator; and
 wherein the input of the reference circuit is coupled to a first terminal of the voltage source and a second terminal of the voltage source is coupled to an inverting input of the comparator.

14. The amplitude regulating circuit of claim 13, wherein the supply circuit and the reference supply circuit each comprise a controllable and/or regulatable current source being coupled to the supply output and the reference supply output, respectively.

15. The amplitude regulating circuit of claim 13, wherein the reference circuit further comprises a field-effect transistor, a source terminal of which is coupled to a reference potential and a drain terminal and a gate terminal of which are coupled to the resistive element, the field-effect transistor comprising a ratio of a width to a length of a channel of the field-effect transistor so that between the source terminal and the drain terminal of the field-effect transistor there is a voltage drop corresponding to a voltage value of the oscillator at the input of the oscillator if the supply current has a current value corresponding to a threshold current value resulting in an initialization of the oscillation of the oscillator.

16. The amplitude regulating circuit of claim 13, wherein a current value of the supply current and a current value of the reference supply current comprise a predetermined ratio to each other.

17. The amplitude regulating circuit of claim 16, wherein the predetermined ratio is in a range between 0.75 and 1.25.

18. The amplitude regulating circuit of claim 13, wherein the comparator comprises an operational amplifier or a differential amplifier circuit.

19. An amplitude regulating apparatus for an oscillator with an input for a supply signal comprising an electrical quantity depending on an amplitude of an oscillation of the oscillator, comprising:

supply means for providing the supply signal based on a control signal;

reference means for a reference supply signal with an electrical reference quantity;

reference supply means for providing the reference supply signal based on the control signal; and comparison means for comparing the electrical quantity and the electrical reference quantity and for providing the control signal based on the comparison of the electrical quantity and the electrical reference quantity.

20. The amplitude regulating apparatus of claim 19, wherein the supply signal and the reference supply signal comprise signal values comprising a predetermined ratio to each other.

21. The amplitude regulating apparatus of claim 20, wherein the predetermined ratio is in a range between 0.75 and 1.25.

22. The amplitude regulating apparatus of claim 19, wherein the comparison means provides the control signal based on a difference of a signal value of the supply signal to a signal value of the reference supply signal.

23. A method for regulating an amplitude, of an oscillation of an oscillator with an input for a supply signal comprising an electrical quantity depending on an amplitude of the oscillation of the oscillator and with a reference circuit with an input for a reference supply signal comprising an electrical reference quantity, comprising:

comparing the electrical quantity and the electrical reference quantity in order to achieve a comparison result; and providing the supply signal and the reference supply signal based on the comparison result.

24. The method of claim 23, further comprising providing a control signal, wherein providing the supply signal and the reference signal is effected based on the control signal.

25. A computer-readable storage medium comprising a program with a program code for performing, when the program is run on a processor, a method for regulating an amplitude of an oscillation of an oscillator with an input for a supply signal comprising an electrical quantity depending on an amplitude of the oscillation of the oscillator and with a reference circuit with an input for a reference supply signal comprising an electrical reference quantity, the method comprising:

comparing the electrical quantity and the electrical reference quantity in order to achieve a comparison result; and providing the supply signal and the reference supply signal based on the comparison result.

\* \* \* \* \*